(12) United States Patent
Albright et al.

(10) Patent No.: US 12,332,570 B2
(45) Date of Patent: Jun. 17, 2025

(54) LITHOGRAPHIC SYSTEM PROVIDED WITH A DEFLECTION APPARATUS FOR CHANGING A TRAJECTORY OF PARTICULATE DEBRIS

(71) Applicants: ASML Holding N.V., Veldhoven (NL); ASML Netherlands B.V., Veldhoven (NL)

(72) Inventors: Ronald Peter Albright, Norwalk, CT (US); Kursat Bal, Arnhem (NL); Vadim Yevgenyevich Joseph Banine, Deurne (NL); Richard Joseph Bruls, Eindhoven (NL); Sjoerd Frans De Vries, Eindhoven (NL); Olav Waldemar Vladimir Frijns, Rosmalen (NL); Yang-Shan Huang, Veldhoven (NL); Zhuangxiong Huang, Eindhoven (NL); Johannes Henricus Wilhelmus Jacobs, Heeze (NL); Johannes Hubertus Josephina Moors, Roosteren (NL); Georgi Nenchev Nenchev, Veldhoven (NL); Andrey Nikipelov, Eindhoven (NL); Thomas Maarten Raasveld, Eindhoven (NL); Manish Ranjan, Eindhoven (NL); Edwin Te Sligte, Waalre (NL); Karl Robert Umstadter, San Diego, CA (US); Eray Uzgören, Eindhoven (NL); Marcus Adrianus Van De Kerkhof, Helmond (NL); Parham Yaghoobi, Eindhoven (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 121 days.

(21) Appl. No.: 17/794,897
(22) PCT Filed: Dec. 24, 2020
(86) PCT No.: PCT/EP2020/087889
§ 371 (c)(1),
(2) Date: Jul. 22, 2022
(87) PCT Pub. No.: WO2021/148224
PCT Pub. Date: Jul. 29, 2021

(65) Prior Publication Data
US 2023/0063156 A1 Mar. 2, 2023

Related U.S. Application Data
(60) Provisional application No. 62/965,140, filed on Jan. 23, 2020, provisional application No. 63/048,513, filed on Jul. 6, 2020.

(51) Int. Cl.
G03F 7/20 (2006.01)
G03F 7/00 (2006.01)
(52) U.S. Cl.
CPC ...... G03F 7/70033 (2013.01); G03F 7/70916 (2013.01); G03F 7/70058 (2013.01)
(58) Field of Classification Search
CPC ............ G03F 7/70033; G03F 7/70916; G03F 7/70058; G03F 7/70908; G03F 7/70933;
(Continued)

(56) References Cited

U.S. PATENT DOCUMENTS 6,862,075 B2  3/2005  Koster et al.
7,145,631 B2  12/2006 Van Herpen
(Continued)

FOREIGN PATENT DOCUMENTS

DE  102011090083 A1  8/2012
DE  102012213927 A1  6/2013
(Continued)

OTHER PUBLICATIONS

International Search Report and Written Opinion of the International Searching Authority directed to related International Patent Application No. PCT/EP2020/087889, mailed Jun. 8, 2021; 11 pages.
(Continued)

*Primary Examiner* — Mesfin T Asfaw
(74) *Attorney, Agent, or Firm* — Sterne, Kessler, Goldstein & Fox P.L.L.C.

(57) ABSTRACT

An apparatus comprising: a radiation receiving apparatus provided with an opening operable to receive radiation from a radiation source through the opening; wherein the radiation receiving apparatus comprises a deflection apparatus
(Continued)

arranged to change a trajectory of a particle through the opening arriving at the radiation receiving apparatus.

15 Claims, 6 Drawing Sheets

(58) Field of Classification Search
CPC .......... H05G 2/008; H05G 2/003; G02B 5/00; G02B 19/0023; G02B 19/0047; G02B 19/0095; G02B 19/0028; G02B 19/00
See application file for complete search history.

(56) References Cited

U.S. PATENT DOCUMENTS

| | | | |
|---|---|---|---|
| 7,812,329 | B2 | 10/2010 | Bykanov et al. |
| 8,071,963 | B2 | 12/2011 | Van Herpen et al. |
| 8,755,032 | B2 | 6/2014 | Yakunin et al. |
| 8,945,310 | B2 | 2/2015 | Zink et al. |
| 9,268,031 | B2 | 2/2016 | Umstadter |
| 2003/0190012 | A1 | 10/2003 | Ahmad |
| 2008/0023657 | A1 | 1/2008 | Melnychuk et al. |
| 2008/0142741 | A1 | 6/2008 | Van Herpen et al. |
| 2009/0154642 | A1* | 6/2009 | Bykanov ............... H05G 2/003 378/34 |
| 2010/0243922 | A1* | 9/2010 | Asayama ............... H05G 2/005 250/504 R |
| 2011/0037960 | A1 | 2/2011 | Scaccabarozzi et al. |
| 2011/0222040 | A1 | 9/2011 | Steinhoff et al. |
| 2013/0070218 | A1 | 3/2013 | Ivanov et al. |
| 2013/0313423 | A1 | 11/2013 | Umstadter |
| 2014/0166051 | A1 | 6/2014 | Umstadter et al. |
| 2014/0211187 | A1 | 7/2014 | Hauf et al. |
| 2019/0335571 | A1 | 10/2019 | Wu et al. |

FOREIGN PATENT DOCUMENTS

| | | |
|---|---|---|
| EP | 1 223 468 A1 | 7/2002 |
| JP | 2003-007611 A | 1/2003 |
| JP | 2003-142296 A | 5/2003 |
| JP | 2006-176819 A | 7/2006 |
| JP | 2008-166772 A | 7/2008 |
| JP | 2009-055072 A | 3/2009 |
| JP | 2010-538456 A | 12/2010 |
| JP | 2011-519156 A | 6/2011 |
| JP | 2012-502492 A | 1/2012 |
| TW | 2005-10954 A | 3/2005 |
| WO | WO 2014/075881 A1 | 5/2014 |

OTHER PUBLICATIONS

International Preliminary Report on Patentability directed to related International Patent Application No. PCT/EP2020/087889, issued Jul. 26, 2022; 8 pages.

Elg et al., "Magnetic debris mitigation system for extreme ultraviolet sources," Proc. of SPIE, Journal of Micro/Nanolithography, MEMS, and MOEMS, vol. 14, No. 1, Feb. 9, 2015; pp. 1-7.

Japanese Notice of Reasons for Refusal directed to Japanese Patent Application No. 2022-544784, mailed Sep. 17, 2024; 13 pages.

Taiwanese Office Action directed to Taiwanese Patent Application No. 110101216, mailed Oct. 14, 2024; 16 pages.

* cited by examiner

LITHOGRAPHIC SYSTEM PROVIDED WITH A DEFLECTION APPARATUS FOR CHANGING A TRAJECTORY OF PARTICULATE DEBRIS

CROSS-REFERENCE TO RELATED APPLICATIONS

This application claims priority of U.S. application 62/965,140 which was filed on 23 Jan. 2020, and U.S. application 63/048,513 which was filed on 6 Jul. 2020, which are incorporated herein in its entirety by reference.

FIELD

The present invention relates to a system comprising a radiation source and a radiation receiving apparatus. In particular, the present invention relates to such a system provided with a deflection apparatus for changing a trajectory of particulate debris that passes from the radiation source to the radiation receiving apparatus. The radiation source may, for example, be an extreme ultraviolet (EUV) laser produced plasma (LPP) source. The radiation receiving apparatus may, for example, comprise a lithographic apparatus.

BACKGROUND

A lithographic apparatus is a machine constructed to apply a desired pattern onto a substrate. lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

A lithographic system may comprise a radiation source that is operable to produce a radiation beam and a lithographic apparatus that is operable to receive said radiation beam and to use it to form an image (for example a diffraction limited image) of a patterning device on a substrate. One known type of radiation source that is used in the field of EUV lithography, is an LPP radiation source.

It may be desirable to provide a new lithographic system, and associated methods for operation, that at least partially addresses one or more problems associated with prior art arrangements, whether identified herein of otherwise.

SUMMARY

According to a first aspect of the invention there is provided a system comprising: a radiation source, the radiation source comprising: a housing provided with an exit aperture; and a radiation generator operable to generate output radiation in the housing and to direct at least a portion of the output radiation through the exit aperture; a radiation receiving apparatus operable to receive the output radiation directed through the exit aperture; a pressure maintaining apparatus operable to maintain a pressure differential across the exit aperture such that a pressure within the housing is higher than a pressure outside the housing; and deflection apparatus disposed outside the housing and arranged to change a trajectory of particles exiting the housing through the exit aperture.

The system may be a lithography system and the radiation receiving apparatus may be a lithographic apparatus. The radiation generator may be operable to produce a laser produced plasma (LPP) and the radiation source may comprise an LPP radiation source. The output radiation may comprise extreme ultraviolet (EUV) radiation. The system according to the first aspect of the invention is advantageous, as now discussed. In an embodiment, the radiation source may be an EUV radiation source.

Within an LPP radiation source a fuel (for example tin) may be partially converted into a plasma that emits radiation. This process may produce fuel debris (for example droplets of molten tin). It is desirable to reduce the amount of such fuel debris that is incident on critical surfaces such as optical components (for example mirrors). It is particularly desirable to prevent fuel debris from propagating from the radiation source into a lithographic apparatus and depositing on optical components therein. In particular, it is desirable to avoid propagation of such fuel debris to a patterning device or reticle of the lithographic apparatus since such fuel debris may have a significant impact on an image formed by the lithographic apparatus (and may result in image defects).

One mechanism that is used to reduce the amount of fuel debris that flows from the housing of the radiation source into the radiation receiving apparatus is the provision of a dynamic gas lock in the vicinity of the exit aperture. To achieve this, a flow of gas (for example hydrogen) is provided from the walls of the housing around the exit aperture generally inwards towards the interior of the housing. This flow of gas acts to force fuel debris propagating towards the exit aperture back into the housing.

It is also known to provide apparatus for stopping or redirecting fuel debris within the housing (for example rotating tin traps and the like).

It is known to provide a flow of hydrogen gas proximate to surfaces within an LPP radiation source (for example a surface of a collector mirror) in order to reduce the amount of tin which is deposited on said surfaces.

Generally, EUV radiation is well absorbed by matter and therefore parts of an EUV lithographic apparatus that the EUV radiation propagates through may be maintained under low pressure (near vacuum) conditions. In general, each of the radiation source and the radiation receiving apparatus may be provided with pressure control apparatus (for example one or more vacuum pumps). It will be appreciated that both of these pressure control apparatus may form part of the pressure maintaining apparatus.

As a result of the hydrogen flow within the housing, and from the dynamic gas lock, the pressure within the housing is generally greater than the pressure outside of the housing. This pressure differential across the exit aperture is at least partially maintained by the dynamic gas lock. Therefore, it will be appreciated that such a dynamic gas lock may form part of the pressure maintaining apparatus (in addition to pressure control apparatus of each of the radiation source and the radiation receiving apparatus).

The inventors of the present invention have realized that although the dynamic gas lock and/or apparatus within the housing for stopping or redirecting fuel debris that is propagating toward the exit aperture may reduce the amount of fuel debris that passes through the exit aperture towards the radiation receiving apparatus, some fuel debris may still pass through the exit aperture into the radiation receiving apparatus. Furthermore, the inventors of the present invention have realized that any such fuel debris that passes through the exit aperture into the radiation receiving apparatus will be accelerated as it passes into the radiation receiving apparatus (for example as it passes a stagnation point) and that this acceleration may allow the fuel debris to propagate a significant distance into the radiation receiving apparatus (and may even allow the fuel debris to propagate to a reticle of a lithographic apparatus). The system according to the first aspect of the invention is advantageous since, it comprises a deflection apparatus that is disposed outside the housing and is arranged to change a trajectory of any such particles exiting the housing through the exit aperture.

It will be appreciated that the deflection apparatus being disposed outside the housing is intended to mean that the deflection apparatus is disposed in a region wherein the pressure is lower than the pressure within the housing.

According to an embodiment, the deflection apparatus comprises: two electrodes disposed outside the housing, and proximate to the exit aperture, the two electrodes spaced apart in a direction at least partially across the exit aperture; and a voltage supply operable to maintain a potential difference between the two electrodes. That is, the deflection apparatus may comprise two electrodes disposed outside the housing, and proximate to the exit aperture, when operable the two electrodes are configured to maintain a potential difference between the electrodes.

In an embodiment, the voltage supply may be DC voltage supply.

In an embodiment, the DC voltage supply may be current limited. For example the maximum current may be set in the range 0.1-1 A, to avoid collateral photo-current creating secondary ionization within the deflector apparatus.

In an embodiment, the DC voltage supply may be pulsed. The pulses may be synchronized with flashes of EUV radiation, to avoid collateral photo-current creating secondary ionization within the deflector apparatus.

It will be appreciated that the exit aperture may define an axis of the radiation source. The axis of the radiation source may extend through the exit aperture from inside the housing to outside the housing. The output radiation may propagate in a direction that is generally along or parallel to the axis. For example, the axis may be an optical axis of the system and may generally coincide with a chief ray of the output radiation. In addition, any debris particles propagating through the exit aperture may travel in a direction that is generally along or parallel to the axis. The opening of the exit aperture may be generally perpendicular to the axis. Therefore, it will be appreciated that the two electrodes being spaced apart in a direction at least partially across the exit aperture may mean that the two electrodes are spaced apart in a direction at least partially perpendicular or transverse to an axis of the radiation source.

As pulses of the output radiation pass through the exit aperture, they may cause gas (for example low pressure hydrogen gas) in the proximity of the exit aperture to form a plasma.

Debris particles in the vicinity of the exit aperture may become charged either directly from the output radiation via the photoelectric effect and/or as a result of propagating through the plasma formed by the pulses of the output radiation.

By providing two electrodes disposed outside the housing and maintaining a potential difference between the two electrodes, the ions in the plasma will drift towards one of the electrodes and the electrons in the plasma will drift towards the other electrode. The drift of ions will exert a pressure on debris particles generally between the two electrodes, i.e. in a direction at least partially across the exit aperture. There may be a neutral ion drift pressure, which may exert a force on the debris particles that is proportional to an area of the debris particles. In addition, there may be a significant charged ion drag, which may exert a force on the debris particles that is proportional to an area with dimensions of the Debye radius within the plasma.

In addition, as a result of the potential difference between the two electrodes, the plasma between the two electrodes will be depleted. In turn, this will remove the screening effect of the plasma such that an electric field will be supported in the regions depleted of plasma (adjacent to the electrodes). A force will be exerted on any charged debris particles in the regions depleted of plasma, the force being in a direction at least partially across the exit aperture.

It will be appreciated that in addition to being spaced apart in a direction at least partially across the exit aperture, the two electrodes may be disposed at substantially the same position in a direction generally through the exit aperture (which may be referred to as an axial direction). Such an arrangement may be preferred since it may allow for a more effective decoupling of the trajectories of debris particles from that of the output radiation. Alternatively, the two electrodes may be spaced apart in a direction generally through the exit aperture.

According to an embodiment, the radiation source comprises an obscuration within the housing and wherein the obscuration and a first one of the two electrodes are arranged such that, in use, the first electrode is at least partially disposed within a shadow of the obscuration.

According to an embodiment, the first electrode comprises a first portion and plurality of fins extending from the first portion and wherein the first electrode is arranged such that, in use, the first portion is substantially disposed within a shadow of the obscuration and wherein the plurality of fins extend out of said shadow.

The first portion of the first electrode may comprise a main portion and a support portion.

According to an embodiment, a second one of the two electrodes is hollow and is disposed outside of a light path of the output radiation and wherein the first electrode is disposed within the hollow second electrode.

Alternatively, the first electrode is according to FIG. 3 (plate+hollow cylinder), but with the fins of FIG. 5 extending inwards from the hollow cylinder electrode.

According to an embodiment, the two electrodes are both disposed substantially outside of a light path of the output radiation. In an embodiment, the two electrodes are for 50%-100% outside of a light path of the output radiation.

The potential difference may be applied directly across the two electrodes, for example, using a single voltage source. Alternatively, each of the two electrodes may be independently biased to different voltages, for example, by different voltage sources.

According to an embodiment, the one of the two electrodes is connected to ground and the other one of the two electrodes is negatively biased.

In an embodiment, an AC bias (with respect to the grounded chamber, comprising illuminator) is applied to one of the two electrodes, while a negative DC bias is applied to the other of the two electrodes. The AC bias being limited in the range 1-100V, preferably in the range 1-10V. This is to increase temperature of electrons within plasma, and so, to boost charge of particles within the plasma.

In principle, any suitable scheme of biasing may be used for applying the potential difference between the two electrodes. It may be preferred to avoid applying positive bias to the electrodes (i.e. for the electrodes to be to be either ground or negatively biased) since any such positive biased electrodes would raise the plasma potential and may result in reduced lifetime for some optics within the system.

According to an embodiment, the voltage supply is operable to maintain a potential difference of the order of 100 to 1000 V between the two electrodes.

According to an embodiment, the radiation generator is arranged to focus at least a portion of the output radiation at an intermediate focus, the intermediate focus being disposed at or proximate to the exit aperture, and wherein the two electrodes are disposed between 10 cm and 30 cm of the intermediate focus.

According to an embodiment, at least one of the two electrodes is provided with a shield arranged to reduce the amount of output radiation that is incident on said at least one of the two electrodes.

The shield may be floating or may be connected to ground. The shield may be formed from a metal. The shield may be formed from a material that is robust to plasma (for example hydrogen plasma) formed by the output radiation. Such a shield may reduce, or eliminate, induced photocurrent from either of the two electrodes if disposed such that some of the output radiation could be incident thereon, particularly if such an electrode is negatively biased.

According to an embodiment, at least one of the two electrodes is provided with a textured surface arranged so reduce scattering of fuel debris in a direction generally from inside the housing to outside the housing.

For example, fuel debris that propagates from inside the housing to outside the housing may be travelling generally in the direction from inside the housing to outside the housing (for example generally along an axis of the system) but may be deflected in a direction generally transverse to this direction by the deflection apparatus. As a result, such fuel debris may impinge on surfaces of the electrodes at a grazing incidence angle and scatter at such a grazing incidence angle overlapping with a trajectory of the output radiation propagating further into the radiation receiving apparatus. Advantageously, the provision of a textured surface (for example a corrugated surface) can reduce such scattering.

According to an embodiment, at least one of the two electrodes is provided with a polished surface arranged to reduce absorption of output radiation incident thereon.

According to an embodiment, a pressure of gas in the vicinity of the deflection apparatus is of the order of 10 Pa or less.

The gas may, for example, comprise hydrogen gas.

According to an embodiment, the radiation generator comprises: a target generator operable to produce a target comprising target material at a plasma formation region, the plasma formation region arranged to receive laser radiation for illuminating the target material to thereby generate a plasma that emits the output radiation; and an optical element arranged to direct at least a portion of the output radiation towards the exit aperture.

A radiation source comprising such a radiation generator may be referred to as an LPP radiation source. The system of the first aspect has particular application for systems comprising such a radiation generator since the conversion of the target material into a plasma in such radiation generators generally results in debris particles of the target material (which, in turn, may be redirected by the deflection apparatus.

According to an embodiment, the radiation generator is arranged to focus at least a portion of the output radiation at an intermediate focus, the intermediate focus being disposed at or proximate to the exit aperture.

According to an embodiment, the output radiation generated by the radiation generator is pulsed.

According to another embodiment, the deflection apparatus comprises: a nozzle device, when operable configured to output a jet flow of fluid in a direction at least partially across the exit aperture.

According to an embodiment, the radiation source comprises an obscuration within the housing and wherein the obscuration and the nozzle device are arranged such that, in use, the nozzle is at least partially disposed within a shadow of the obscuration.

According to an embodiment, the nozzle device comprises a plurality of nozzles along a direction from inside the housing to outside the housing.

According to an embodiment, the nozzle device can be combined with the electrodes.

According to an embodiment, the deflection apparatus further comprises a structure disposed at least partially outside a light path of the output radiation and at least partially at the direction at least partially across the exit aperture, the structure is configured to receive an particle with a speed and decrease the speed after receiving the particle by at least 30%.

According to another aspect of the invention there is provided, a lithographic system comprising the system of any preceding claim; wherein the radiation receiving apparatus comprises a lithographic apparatus operable to receive the output radiation from the radiation source and to form an image of a patterning device on a substrate using said output radiation.

BRIEF DESCRIPTION OF THE DRAWINGS

Embodiments of the invention will now be described, by way of example only, with reference to the accompanying schematic drawings, in which.

DETAILED DESCRIPTION

Figure 1:
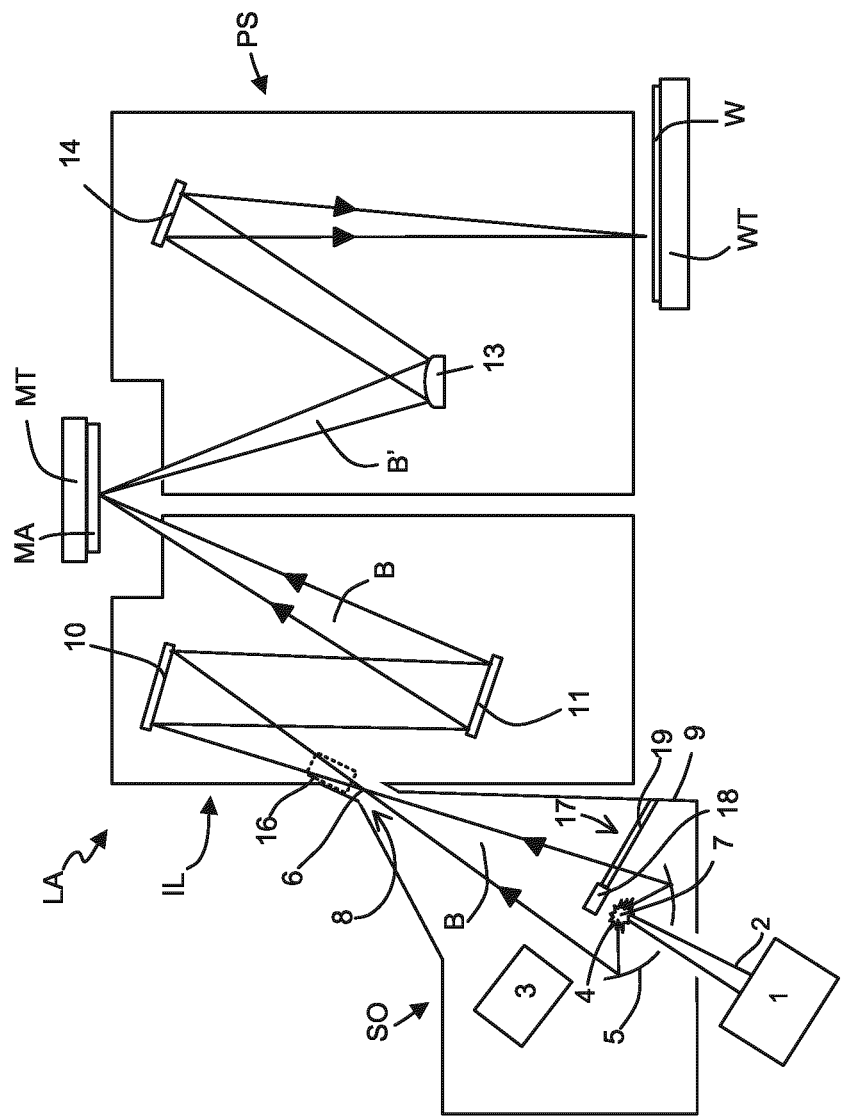
FIG. 1 depicts a lithographic system comprising a lithographic apparatus and a radiation source.

FIG. 1 shows a lithographic system according to an embodiment of the present invention comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B' thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

The radiation source SO shown in FIG. 1 is, for example, of a type which may be referred to as a laser produced plasma (LPP) source. A laser system 1, which may, for example, include a CO2 laser, is arranged to deposit energy via a laser beam 2 into a fuel, such as tin (Sn) which is provided from, e.g., a fuel emitter 3. The laser beam 2 may be referred to as the laser radiation 2. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. Therefore the fuel emitter 3 may be considered to be a target generator operable to produce a target (for example a stream of tin droplets) comprising target material (for example tin) at the plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The laser radiation 2 may have any suitable wavelength. In some embodiments, the laser radiation 2 has a wavelength of around 10 μm, which may be produced by a CO2 laser. In some embodiments, the laser radiation 2 has a wavelength of around 1 μm, which may be produced by a YAG (yttrium aluminium garnet) based laser.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The collector 5 may be considered to be an optical element that is arranged to focus at least a portion of the radiation generated by the plasma 7 at the intermediate focus 6.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The collector 5 may be considered to be an optical element arranged to direct at least a portion of the output radiation (i.e. EUV radiation beam B) towards the opening 8. The radiation source SO is arranged such that the intermediate focus 6 is located at or proximate to an opening 8 in an enclosing structure 9 of the radiation source SO. The opening 8 in the enclosing structure 9 may be referred to as an exit aperture 8 and the enclosing structure 9 may be referred to as a housing 9 provided with the exit aperture 8.

The radiation source SO is provided with a shield 18 which may be arranged to prevent the laser beam 2 from propagating through the opening 8 and into the lithographic apparatus LA (where it may damage optical components). The shield 18 is supported by the enclosing structure 9 via a support bar 19. Together, the shield 18 and the support bar 19 form an obscuration 17 of the radiation source SO, as now discussed. The collector 5 is generally of the form of a concave mirror, which is arranged to collect the radiation which is emitted from the plasma formation region 4 into a solid angle subtended by the collector 5. This radiation is reflected and focused at the intermediate focus 6. As a result, within the housing, the radiation beam B is generally of the form of a converging cone of radiation, which converges at the intermediate focus 6, an outer edge of this cone being indicated in FIG. 1 by two lines. However, the obscuration 17 formed by the shield 18 and the support bar 19 will block a portion of this radiation cone such that there will be some portion of this cone which will not receive radiation from the collector 5.

It will be appreciated that a main direction of radiation followed through the lithographic system (which may, for example, correspond to a direction of a chief ray of radiation beams B, B') may be referred to as an optical axis of the system. Unless stated otherwise, as used herein an axial direction is intended to mean a direction along a (local)

optical axis and a radial direction is intended to mean a direction perpendicular to, and extending through, the (local) optical axis. The optical axis of the lithographic system proximate to the opening 8 corresponds to an axis of the converging and diverging cones of radiation.

The fuel emitter 3 and the plasma formation region 4 arranged to receive the laser beam 2 for illuminating the target material may together be considered to form a radiation generator operable to generate output radiation in the enclosing structure 9 and to direct at least a portion of that output radiation (i.e. EUV radiation beam B) through the opening 8. The collector 5 may also be considered to form part of the radiation generator.

The lithographic apparatus LA may be considered to be a radiation receiving apparatus operable to receive the output radiation (i.e. EUV radiation beam B) directed through the exit aperture 8.

Within an LPP radiation source SO a fuel (for example tin) is partially converted into the plasma 7 that emits radiation B. In general, this process produces fuel debris (for example droplets of molten tin). It is desirable to reduce the amount of such fuel debris that is incident on critical surfaces such as optical components (for example mirrors) within the lithographic apparatus. It is particularly desirable to prevent fuel debris from propagating from the radiation source SO into a lithographic apparatus LA and depositing on optical components therein. In particular, it is desirable to avoid propagation of such fuel debris to a patterning device MA or reticle of the lithographic apparatus LA since such fuel debris may have a significant impact on an image formed on the substrate W by the lithographic apparatus LA (and may result in image defects).

One mechanism that is used to reduce the amount of fuel debris that flows from the housing 9 of the radiation source SO into the lithographic apparatus LA is the provision of a dynamic gas lock in the vicinity of the exit aperture 8. To achieve this, a flow of gas (for example hydrogen) is provided from the walls of the housing 9 around the exit aperture 8 generally inwards towards the interior of the housing 8. This flow of gas acts to force fuel debris propagating towards the exit aperture 8 back into the housing 9. It is also known to provide apparatus for stopping or redirecting fuel debris within the housing (for example rotating foil traps and the like).

A pressure difference, maintained by the dynamic gas lock between radiation source SO and illuminator IL, allows for some gas flow, directed towards mirror 10. A neutral and ion drag forces, created by such flow may accelerate some debris from SO and direct them towards critical surfaces, it is desirable to change the trajectories of such particles in a way to minimize the chance the land on the mask MA.

It is known to provide a flow of hydrogen gas proximate to surfaces within an LPP radiation source SO (for example a surface of the collector mirror 5) in order to reduce the amount of tin which is deposited on said surfaces.

Although FIG. 1 depicts the radiation source SO as a laser produced plasma (LPP) source, any suitable source such as a discharge produced plasma (DPP) source or a free electron laser (FEL) may be used to generate EUV radiation.

As schematically indicated in FIG. 1, the lithographic system further comprises a deflection apparatus 16 disposed outside the housing 9 and arranged to change a trajectory of particles exiting the housing 9 through the exit aperture 8. Such an arrangement is advantageous, as now discussed.

Generally, EUV radiation is well absorbed by matter and therefore parts of an EUV lithographic system that the EUV radiation propagates through may be maintained under low pressure (near vacuum) conditions. A relative vacuum, i.e. a small amount of gas (e.g. hydrogen) at a pressure well below atmospheric pressure, may be provided in the radiation source SO, in the illumination system IL, and/or in the projection system PS.

In general, each of the radiation source SO and the lithographic apparatus LA may be provided with pressure control apparatus (for example one or more vacuum pumps). It will be appreciated that both of these pressure control apparatus may be considered to form part of a pressure maintaining apparatus of the lithographic system. This pressure maintaining apparatus is operable to maintain a pressure differential across the exit aperture 8 such that a pressure within the housing 9 being is higher than a pressure outside the housing 9.

As a result of the hydrogen flow within the housing 9, and from the dynamic gas lock, the pressure within the housing 9 is generally greater than the pressure outside of the housing 9 (i.e. in the illumination system IL). This pressure differential across the exit aperture 8 is at least partially maintained by the dynamic gas lock. Therefore, it will be appreciated that such a dynamic gas lock may form part of the pressure maintaining apparatus (in addition to pressure control apparatus of each of the radiation source SO and the lithographic apparatus LA).

The inventors of the present invention have realized that although the dynamic gas lock and/or apparatus within the housing for stopping or redirecting fuel debris that is propagating toward the exit aperture 8 may reduce the amount of fuel debris that passes through the exit aperture towards the lithographic apparatus LA, some fuel debris may still pass through the exit aperture 8 into the lithographic apparatus LA. Furthermore, the inventors of the present invention have realized that any such fuel debris that passes through the exit aperture 8 into the lithographic apparatus LA will be accelerated as it passes into the lithographic apparatus LA (for example as it passes a stagnation point) and that this acceleration may allow the fuel debris to propagate a significant distance into the lithographic apparatus LA (and may even allow the fuel debris to propagate to the patterning device MA).

Particles which escape from the radiation source SO to the lithographic apparatus LA may have an initial speed (for example at a stagnation plane separating the higher pressure radiation source SO from the lower pressure lithographic apparatus LA) of the order of 10 to 100 m/s. A jet of hydrogen gas which escapes from the radiation source SO to the lithographic apparatus LA may have a speed of the order of 1000 m/s and, in general, may propagate generally along an optical axis of the system towards the faceted field mirror device 10, which may be or the order of 15-150 cm from the intermediate focus 6. The hydrogen jet escaping from the radiation source SO into the lithographic apparatus LA may have a speed of the order of 1000 m/s and a pressure of the order of 10-100 Pa. This will increase the speed of any fuel debris particles in this direction. The additional increase in speed for such particles will, in general, be dependent on the size of the particles.

In a flow of molecular hydrogen under these conditions (speed of 1000 m/s and pressure of 10 Pa), particles will be subject to a molecular drag force. As a result of this molecular drag force, particles with a dimension of the order of 1 μm may increase in speed by around 10 m/s whereas particles with a dimension of the order of 0.1 μm may increase in speed by around 30 m/s.

As pulses of the radiation beam B pass through the exit aperture 8, they may ionise the hydrogen gas in the proximity of the exit aperture 8 so as to form a plasma. Therefore the hydrogen within the jet which escapes the housing 9 may be ionised and may produce a significant ion drag force. Whilst the molecular drag force may exert a force on the debris particles that is proportional to an area of the debris particles, the ion drag force on the debris particles is proportional to an area with dimensions of the Debye radius within the plasma. As a result of this ion drag force, particles with a dimension of the order of 1 μm may increase in speed by around 15 m/s whereas particles with a dimension of the order of 0.1 μm may increase in speed by around 100 to 300 m/s. Therefore, particularly for smaller particles with a dimension of the order of 0.1 μm, the increase in speed from the ion drag is significantly larger than the molecular drag force. The above estimates are only valid only as long as Debye approximation is applicable, that is that the Debye radius is much smaller than the distance to the nearest wall.

However, if the plasma dissipates (and there are no ions to be deflected by particle) then the ion drag drops to zero.

Fuel particles from the radiation source SO generally follow the same path as the radiation beam B. Fuel particles are typically sufficiently hot that they comprise molten tin. The particles themselves may be molten upon release from surfaces of the radiation source SO since they may be formed by spitting. In addition, radiative cooling of these particles is inefficient and, furthermore, the particles may be further heated by the plasma 7 and the radiation emitted by the plasma and by direct absorption of EUV radiation and out-of-band radiation. Therefore, the fuel particles typically comprise molten tin, for example at a temperature of the order of 300 to 500° C. Therefore, these fuel droplets may remain molten for a while as they move into and through the lithographic apparatus. As a result, the fuel droplets may bounce off mirrors, for example the faceted field mirror device 10 and the faceted pupil mirror device 11 (and maybe, other surfaces) like rubber balls, with surface tension providing springiness. At each bounce, a substantial heat transfer takes place, and so there is a chance that the moment such a droplet impinges on the patterning device MA, it may cool sufficiently such that it solidifies and thus cannot bounce.

In this way, debris particles from the radiation source SO can contribute to defectivity of the patterning device. It is estimated that approximately 30% of all particles that are incident on the patterning device originate from the radiation source SO in this way.

The lithographic system shown in FIG. 1 is advantageous since it comprises the deflection apparatus 16 that is disposed outside the housing 9 and is arranged to change a trajectory of any particles exiting the housing 9 through the exit aperture 8. It will be appreciated that the deflection apparatus 16 being disposed outside the housing 9 is intended to mean that the deflection apparatus is disposed in a region wherein the pressure is lower than the pressure within the housing 9.

Generally, the pressure difference between the radiation source SO and illuminator IL is in the order 5-50 times. Providing deflection apparatus in the lower pressure region is advantageous, since it acts through electrostatic depletion of plasma, created by EUV ionizing the gas, the lower pressure means higher ion mobility (in the given electric field, provided by deflection apparatus) and lower absolute number of ions created per EUV flash, both contributing to higher efficiency of deflection apparatus.

In some embodiments, one or more electrodes are used to create an ion drag and/or Coulomb force that acts to de-couple trajectories of fuel particles output from the radiation source SO from the path of the EUV radiation beam B. Ion drag is an exchange of momentum between the fuel particles and (positive) ions, which are either collected by the (negatively charged) fuel particle, or deflected by the (positively charged) fuel particle.

One example embodiment is now described with reference to FIGS. 2 to 4.

Figure 2:
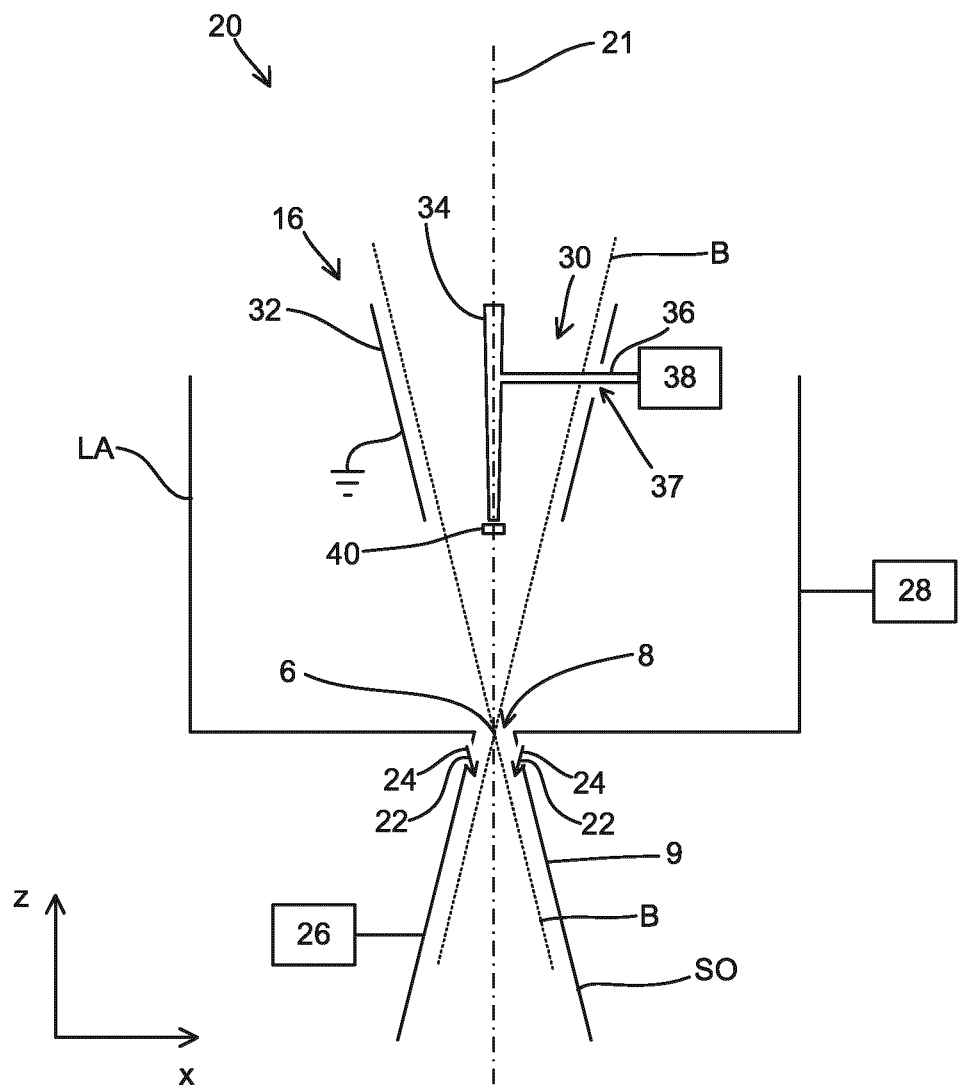
FIG. 2 depicts a first cross sectional view of a system according to an embodiment of the invention, which may form part of the lithographic system shown in FIG. 1.
Figure 3:
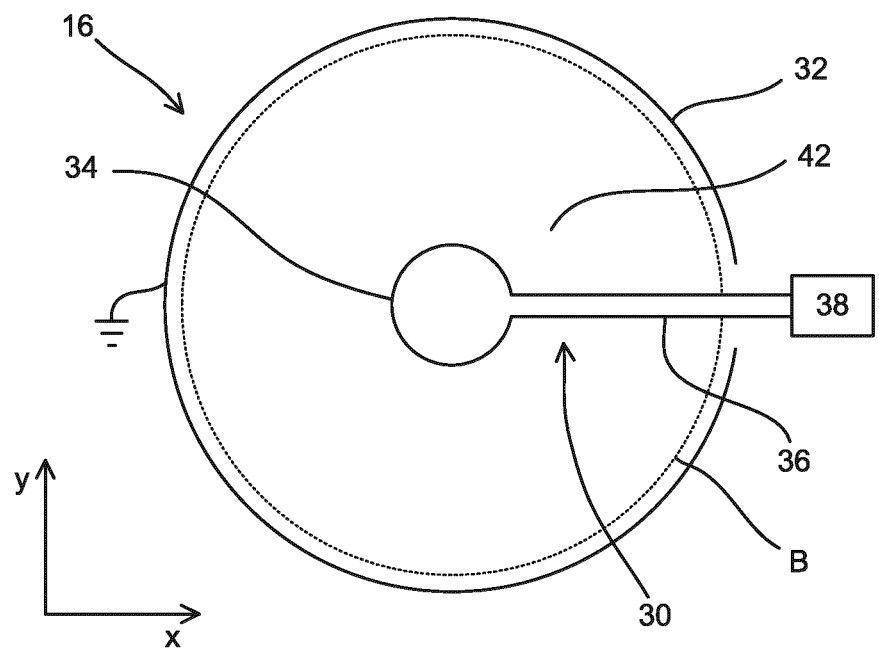
FIG. 3 depicts a second cross sectional view of the system shown in FIG. 2.

FIGS. 2 and 3 show a system 20, which may form part of the lithographic system shown in FIG. 1. Features of the system 20 which are equivalent to features shown in FIG. 1 and described above share common reference numerals therewith.

FIG. 2 shows part of the radiation source SO and part of the lithographic apparatus LA as shown in FIG. 1. In particular, a part of the housing 9 of the radiation source SO proximate to the opening 8 (also referred to as the exit aperture 8) is shown. Also shown is a portion of the lithographic apparatus LA on the other side of the opening 8 (i.e. outside the housing 9).

FIG. 2 also shows the general propagation path of the output radiation beam B, which is focused (by the collector 5; not shown) at the intermediate focus 6, proximate to the opening 8. Within the housing, the radiation beam B is generally of the form of a converging cone of radiation, an outer edge of this cone being indicated in FIG. 2 by two lines. This cone converges at the intermediate focus 6. Downstream of the intermediate focus 6, the radiation beam B is generally of the form of a diverging cone of radiation, an outer edge of this cone being indicated in FIG. 2 by two lines (and indicated in FIG. 3 by a circle). An optical axis 21 of the system 20 in the vicinity of the opening 8 is also shown in FIGS. 2 and 3.

The optical axis 21 extends through the exit aperture 8 from inside the housing 9 to outside the housing 9. The output radiation B propagates in a direction that is generally along or parallel to the optical axis 21. For example, the optical axis 21 of the system 20 may generally coincide with a chief ray of the output radiation B. In addition, any debris particles propagating through the exit aperture 8 may travel in a direction that is generally along or parallel to the optical axis 21. The opening of the exit aperture may be considered to be generally perpendicular to the optical axis 21.

The housing 9 of the radiation source SO is provided with a plurality of channels 22 through which a flow of gas (for example hydrogen gas) is provided. The channels 22 are provided proximate to the opening 8 and are orientated such that the flow of gas 24 is directed away from the opening and into an interior of the housing 9. These channels and the flow of gas together provide a dynamic gas lock in the vicinity of the opening 8. The flow of gas 24 acts to force fuel debris propagating towards the exit aperture 8 back into the housing 9.

Optionally, the radiation source SO may also be provided with one or more additional flows of hydrogen gas (not shown) proximate to surfaces within the radiation source SO (for example a surface of the collector mirror 5) in order to reduce the amount of tin which is deposited on said surfaces.

The radiation source SO is provided with a pressure control apparatus 26, which may, for example, comprise one or more vacuum pumps. Similarly, the lithographic apparatus LA is provided with a pressure control apparatus 28, which may, for example, comprise one or more vacuum pumps.

Together, these two pressure control apparatus 26, 28 form part of a pressure maintaining apparatus of the lithographic system. In particular, this pressure maintaining apparatus is operable to maintain a pressure differential across the exit aperture 8 such that a pressure within the housing 9 being is higher than a pressure outside the housing 9. For example, the pressure within the housing 9 may be maintained at around 100 Pa whereas the pressure outside the housing 8 (for example, in the illumination system IL) may be maintained at around 5 Pa.

Also shown is the deflection apparatus 16, which is disposed outside the housing 9 and arranged to change a trajectory of particles exiting the housing 9 through the exit aperture 8.

The deflection apparatus 16 comprises two electrodes 30, 32 disposed outside the housing 9, and proximate to the exit aperture 8.

A first electrode 30 of the two electrodes is a disposed within the diverging radiation cone of the radiation beam B. In particular, the first electrode 30 comprises a main portion 34 that is provided generally in the centre of this radiation cone and which extends along an axis of the radiation cone. The main portion 34 of the first electrode 30 is generally cylindrical, although it may taper at a similar angle to that of the radiation cone. The first electrode 30 further comprises a support portion 36 arranged to support the main portion 30. A support portion 36 may a comprise of a rod, or a tapered sheet, filling the shadow of the obscuration bar within the hollow cone.

Although disposed within the radiation cone of the radiation beam B, as discussed further below, the first electrode 30 is disposed such that, in use, the first electrode 30 is generally disposed within a shadow of the obscuration 17 of the radiation source SO.

A second electrode 32 of the two electrodes is hollow and is disposed outside of the radiation cone of the radiation beam B. Therefore, the second electrode 32 is disposed outside of a light path of the radiation beam B. The second electrode 32 is generally frusto-conical in shape, an angle of the second electrode 32 generally matching that of the cone of radiation SO such that a generally uniform gap may be formed therebetween. The gap may, for example be of the order of 1-10 mm. The first and second electrodes 30, 32 are generally axially aligned and have generally matching axial extents.

Generally, positioning of electrodes outside of EUV light path, or protecting them by floating (or grounded) shields is beneficial, as it is aimed to minimize photo-current, produced by absorbing EUV (and out of band) radiation. Such photo-current is capable to increase thermal load on electrodes and/or amount of electrons and ions within the deflector apparatus, which is undesirable.

The first electrode 30 is disposed within the hollow second electrode 32. In order to facilitate this, the support portion 36 of the first electrode may extend (generally radially) through an opening 37 in the second electrode 32. The opening 37 may have a sufficient gap between the two electrodes 30, 32 or may be provided with an insulating material between the two electrodes 30, 32 so as to avoid contact between the two electrodes 30, 32. Vacuum (of low pressure gas filled gap) also can act as an insulator between the electrodes, should the distance between them exceed 10 mm.

The first and second electrodes 30, 32 are separated in a radial direction. Therefore, the two electrodes 30, 32 are spaced apart in a direction at least partially across the exit aperture 8 (i.e. generally perpendicular to the optical axis, which passes through the exit aperture 8). It will be appreciated that the two electrodes 30, 32 being spaced apart in a direction at least partially across the exit aperture 8 may mean that the two electrodes 30, 32 are spaced apart in a direction at least partially perpendicular or transverse to the optical axis 21.

In this embodiment, the first electrode 30 is connected to a direct current (DC) power source 38 which is arranged to negatively bias the first electrode 30. In addition the second electrode 32 is connected to ground. As a result, a potential difference is maintained between the two electrodes 30, 32. The power source 38 and the connection between the second electrode 32 and ground may be considered to both form part of a voltage supply that is operable to maintain a potential difference between the two electrodes 30, 32.

In other embodiments, other scheme of biasing may be used for applying the potential difference between the two electrodes 30, 32. In principle, any suitable scheme of biasing may be used for applying the potential difference between the two electrodes 30, 32. It may be preferred to avoid applying positive bias to the electrodes 30, 32 (i.e. for the electrodes to be to be either ground or negatively biased) since any such positive biased electrodes would raise the plasma potential of any plasma formed therebetween and may result in reduced lifetime for some optics within the system 20.

The DC power source 38 is arranged to bias the first electrode 30 at a voltage of the order of −100 V to −1000 V such that the potential difference between the two electrodes 30, 32 is of the order of 100 to 1000 V. For example, the DC power source 38 may be arranged to bias the first electrode 30 at a voltage of the order of −200 V. The potential difference between the two electrodes 30, 32 may be selected so as to limit a current between the two electrodes 30, 32 to of the order of 0.1-1 A. It will be appreciated that an independent control of maximum current may be implemented at once with the DC voltage supply; for example to supress any and all peak currents (exceeding 0.1-1 A) associated with photo-current, rather than extracted ion current.

Figure 4:
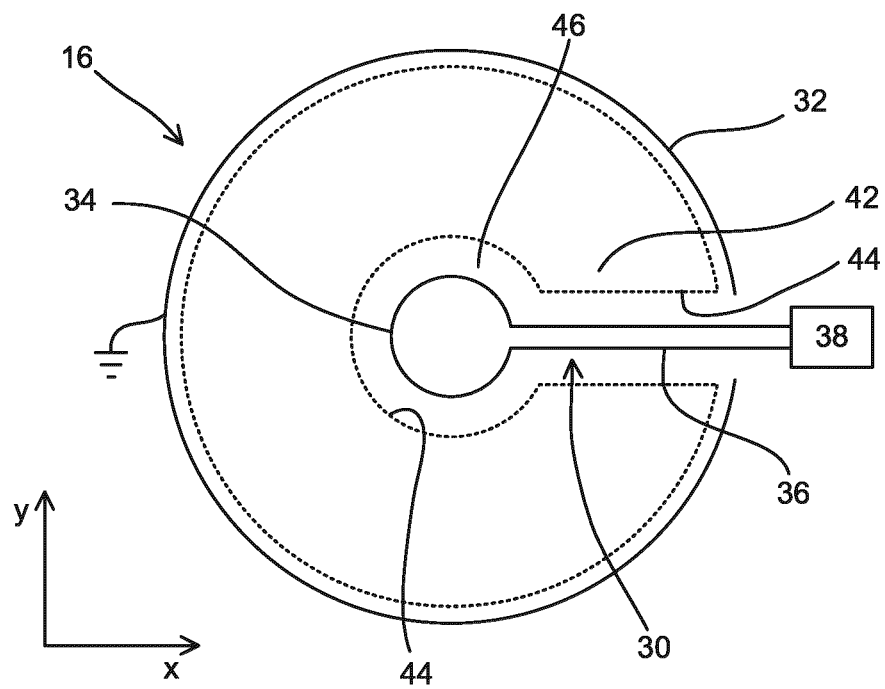
FIG. 4 depicts the second cross sectional view of the system shown in FIG. 3 after some depletion of a hydrogen plasma, showing a plasma region and a depletion region.

The operation of the deflection apparatus 16 shown in FIGS. 2 and 3 is now described, with reference to FIGS. 3 and 4.

As pulses of the radiation beam B pass through the exit aperture 8, they cause gas (for example low pressure hydrogen gas) in the proximity of the exit aperture 8 to form a plasma 42. Initially, as shown in FIG. 3, the plasma 42 occupies a volume between the first electrode 30 and an outer periphery of the radiation beam B.

Debris particles (for example tin debris) in the vicinity of the exit aperture 8 may become charged either directly from the output radiation via the photoelectric effect and/or as a result of propagating through the plasma formed by the pulses of the radiation beam B. It is expected that the dominant process is that debris particles gain a (negative) charge as a result of propagating through the plasma formed by the pulses of the radiation beam B. Note that once the plasma is depleted, this charge is 'frozen' onto the particles.

As a result of the potential difference between the two electrodes 30, 32, the ions in the plasma 42 will drift towards the first (negatively biased) electrode 30 and the electrons in the plasma will drift towards the second (grounded) electrode 32. The drift of ions near charged particles will exert a pressure on such particles generally in the direction perpendicular to the two electrodes 30, 32, known as ion drag, in a generally radial direction.

In addition, as a result of the potential difference between the two electrodes 30, 32, the plasma 42 between the two electrodes 30, 32 will be depleted. For example, as shown in FIG. 3, as a pulse of EUV radiation beam B passes through the opening 8, plasma 42 may be formed in a volume between the first electrode 30 and an outer periphery of the cone of radiation defined by the radiation beam B. Once the radiation pulse has passed, the plasma 42 may start to deplete as ions recombine at the first electrode 30 and electrons flow into the second electrode 32. The plasma 42 starts to deplete at a surface 44 of the plasma region closest to the first (negatively biased) electrode 30, forming a depletion region 46 around the first electrode 30, as shown in FIG. 4. As the plasma 42 is depleted, the surface 44 of the plasma region 42 closest to the first electrode 30 propagates away from the first electrode 30. This depletion wave may propagate at a speed of the order of 0.2-1 cm/μs, depending on a density of the plasma (the speed of the depletion wave is greater for hotter gas, resulting in lower density and lower concentration of ion generated by each EUV flash). The temperature of the hydrogen gas within the deflection apparatus may be in the range of 30-300° C.

It will be appreciated that the electric field strength is zero within the plasma 42. However, the above-described depletion of the plasma 42 will remove the screening effect of the plasma 42 such that an electric field will be supported in the region 46 depleted of plasma (adjacent to the first electrode 30). A force will be exerted on any charged debris particles in the region 46 depleted of plasma, the force being in a direction at least partially across the exit aperture 8. In particular the force will be generally between the first electrode 30 and a (receding) surface 44 of the plasma region 42 until the plasma is completely depleted and thereafter the force will be generally between the first electrode 30 and the second electrode 32. The force may be generally radial and may therefore act to decouple any charged debris particles from the trajectory of the radiation beam B.

In this way, the first and second electrodes 30, 32 are used to locally deplete the plasma induced by the radiation beam B, resulting in a lateral electric field and a lower longitudinal and higher lateral ion drag force thereby pushing debris particles coming through the opening 8 out of the optical path.

An axial position and extent of the two electrodes 30, 32 of the deflection apparatus 16 may be selected based on the following considerations.

In principle, in the absence of any other considerations (see below for some such considerations), it may be generally desirable for the two electrodes 30, 32 of the deflection apparatus 16 to be placed as close as possible to the intermediate focus 6, although downstream of a stagnation plane that separates the higher pressure inside the housing 9 from the lower pressure outside the housing 9. This is because the earlier the deflective force is applied to the trajectory of a debris particle, for a force of a given magnitude, the greater the chance that that debris particle will be deflected such that it does not impinge on the next optical component (for example, the faceted field mirror device 10). Generally, reducing the separation between the two electrodes allows to keep the electric field same, while reducing required bias. The bias must be limited to avoid collateral sputtering of negatively biased electrode with (high energy) ions.

It may also be generally desirable for an axial extent of the two electrodes 30, 32 of the deflection apparatus 16 to be as large as possible so as to maximise the deflective force which is applied to the trajectory of debris particles. Also, longer deflection apparatus implies that radial force is applied to the particles propagating though it longer, so the angular deflection is greater.

In addition, in practice, there is a limit to how close the two electrodes 30, 32 of the deflection apparatus 16 can be placed to a next optical element (such as, for example, the faceted field mirror device 10). As can be seen from FIG. 1, since the optics within the lithographic system are reflective, there is a limit to how close the deflection apparatus 16 can extend towards the faceted field mirror device 10 without at least partially blocking the radiation beam that has been reflected from the faceted field mirror device 10.

For embodiments which have an electrode 30 disposed within the diverging light cone of the radiation beam B, as discussed above, it may be desirable for the first electrode 30 to be disposed such that the first electrode 30 is generally disposed within a shadow of the obscuration 17 of the radiation source SO. Advantageously, such an arrangement reduces the amount of radiation B which is absorbed by the first electrode 30 and reduces undesired photo-current.

In order to achieve this, it may be desirable for the two electrodes 30, 32 of the deflection apparatus 16 to be placed close to a conjugate plane to the obscuration 17 in which a sharp image or shadow of the obscuration 17 is formed. For example, it may be desirable for the two electrodes 30, 32 of the deflection apparatus 16 to be placed sufficiently downstream of the stagnation plane that separates the higher pressure inside the housing 9 from the lower pressure outside the housing 9 such that a sharp image or shadow of the obscuration 17 is formed.

In some embodiments, the two electrodes 30, 32 may be disposed within between around 10 cm and 30 cm of the intermediate focus 6. If the electrodes are disposed any closer than this then the shadow of the obscuration 17 is not sufficiently sharp enough to avoid significant EUV light absorption by the first electrode 30. In one embodiment, the first and second electrodes 30, 32 may have an axial extent of around 20 cm. A diameter of the second electrode may increase from around 10 cm at a first end to around 20 cm at a second end.

Although the first electrode 30 may be disposed such that the first electrode 30 is generally disposed within a shadow of the obscuration 17 of the radiation source SO, this shadow will not, in general, be perfectly sharp. Therefore, in general, at least some radiation from the radiation beam B could be incident on the first electrode 30. In order to avoid, or at least reduce this, as shown in FIG. 2, the first electrode 30 may (optionally) be provided with a shield 40 arranged to reduce the amount of radiation from the radiation beam B that is incident on the first electrode 30. The shield 40 may be floating or may be connected to ground. The shield 40 may be formed from a metal. In particular, the shield may be formed from a material that is robust to plasma (for example hydrogen plasma) formed by the radiation beam B. Such a shield 40 may reduce, or eliminate, induced photo-current from the first electrode 30, which may be disposed such that some of the radiation beam B could be incident thereon. This is particularly advantageous for the configuration when the first electrode 3 is negatively biased. The shield 40 may be applied in all the embodiments disclosed.

A variant of the embodiment described above with reference to FIGS. 2 to 4 is now described with reference to FIG. 5. The embodiment shown in FIG. 5 shares many features in common the embodiment shown in FIGS. 2 to 4 and only the differences will be described here.

Figure 5:
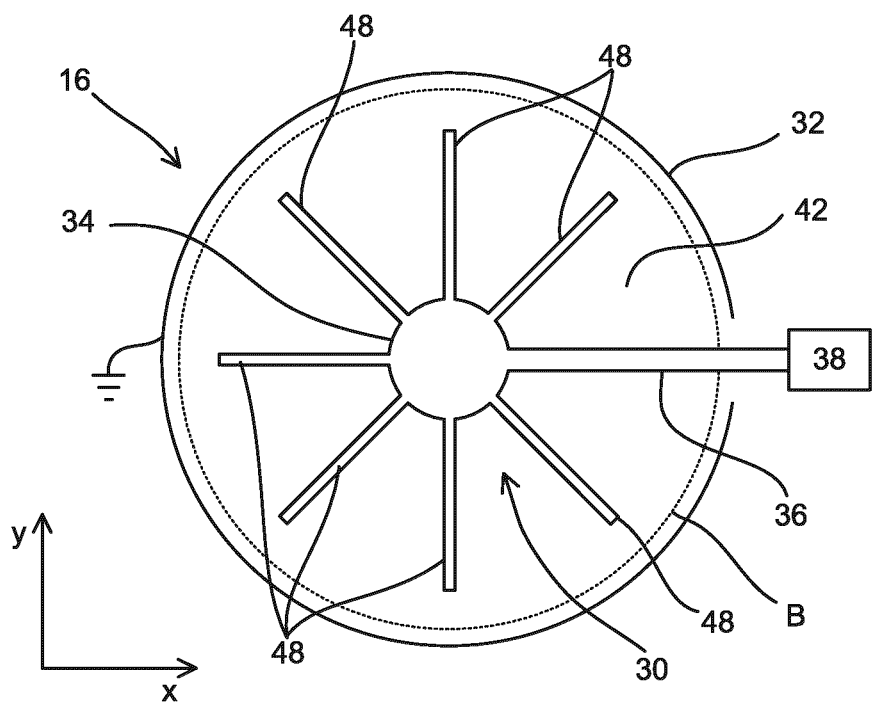
FIG. 5 depicts a cross sectional view, in the same plane as the view of FIG. 2, of a system according to another embodiment of the invention, which may form part of the lithographic system shown in FIG. 1.

In the embodiment shown in FIG. 5, in addition to the main portion 34 and the support portion 36, the first electrode 30 further comprises a plurality of fins 48 extending from, and supported by, the main portion 30. Each of the fins 48 may comprise a plate having a thickness of the order of 200-2000 µm. Each of the fins 48 may extend radially and axially. The fins 48 may serve to speed up the depletion of the hydrogen plasma 42 formed by the radiation beam B whilst only absorbing a relatively small fraction of the radiation beam B.

In some of the embodiments, at least one of the two electrodes 30, 32 is provided with a textured surface arranged to reduce scattering of fuel debris in a direction generally from the inside the housing 9 to outside the housing 9. That is the textured surface may be arranged to reduce scattering of fuel debris in a generally axial direction away from the radiation source SO (for example at grazing incidence angles). The textured surface may be applied in all the embodiments disclosed, e.g. at least a part of the deflection apparatus 160 and 1600 may be provided with the textured surface.

For example, fuel debris that propagates from inside the housing 9 to outside the housing 9 may be travelling generally in the axial direction from the inside the housing 9 to outside the housing 9 but may be deflected in a direction generally transverse to this axial direction by the deflection apparatus 16. As a result, such fuel debris may impinge on surfaces of the electrodes 30, 32 at a grazing incidence angle and scatter at such a grazing incidence angle overlapping with a trajectory of the radiation beam B propagating further into the lithographic apparatus LA. Advantageously, the provision of a textured surface (for example a corrugated surface) can reduce such scattering.

In some embodiments, at least one of the two electrodes 30, 32 may be provided with a polished surface arranged so reduce absorption of radiation from the radiation beam B that is incident thereon. The polished surface may be applied in all the embodiments disclosed, e.g. at least a part of the deflection apparatus 160 and 1600 may be provided with the polished surface.

The above-described embodiments use two electrodes 30, 32 disposed proximate to but downstream of the intermediate focus 6. This particular placement of the two electrodes 30, 32 is particularly advantageous, as now discussed.

An arrangement of electrodes within the housing 9 of the radiation source SO may not be feasible due to the pressure of gas in the housing 9. For example, the housing 9 may contain hydrogen gas at a pressure of around 100 Pa. This is of the order of a factor of 5 to 50 greater than the pressure outside the housing 9. Furthermore, within the housing 9 there will typically be some out-of-band radiation that is emitted by the tin plasma 7, but which is not output through the opening 8. As a result, within the housing 9 there may be of the order of 10 to 50 times more hydrogen plasma produced by ionization. The magnitude of electric field that would be required to deplete such a dense hydrogen plasma would be beyond the breakdown threshold and so would create plasma instead of dissipating it.

In general, a pressure of gas in the vicinity of the deflection apparatus may be of the order of 20 Pa or less, for example of the order of 10 Pa or less.

Furthermore, an arrangement of electrodes which are further into the lithographic apparatus (for example closer to the patterning device MA) will, for an equivalent deflection force, be less effective at avoiding debris impinging on the patterning device MA.

It will be appreciated that in alternative embodiments, different arrangements of electrodes and biasing schemes for these electrodes may be used.

For example, the potential difference may be applied directly across the two electrodes 30, 32, for example, using a single voltage source. Alternatively, each of the two electrodes 30, 32 may be independently biased to different voltages, for example, by different voltage sources. In one alternative embodiment, the second electrode 32 is negatively biased and the first electrode 30 is connected to ground. In addition, other combinations of biases are possible (preferably both electrodes 30, 32 being negative). It is desirable to avoid positive bias since this raises the plasma potential of the hydrogen plasma and may lead to optics lifetime issues.

It will be appreciated, that AC bias, or a combination of AC and DC bias may be applied to any of the electrodes. The DC voltage is used to dissipate the plasma, while the AC voltage is used to raise electron temperature within the plasma and thus boost the charge of particles, residing inside plasma, such that the radial force is increased once particles are located in plasma depleted region.

In an alternative arrangement, electrodes may be provided which are both disposed outside of a main light path of the radiation beam B (i.e. outside of the main cone of radiation).

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

In an embodiment, a flow nozzle device may be used to create an neutral molecule drag force that acts to de-couple trajectories of fuel particles output from the radiation source SO from the path of the EUV radiation beam B. Neutral molecule drag is an exchange of momentum between the fuel particles and neutral molecules, which are deflected by the fuel particle.

One example embodiment is now described with reference to FIG. 6.

Figure 6:
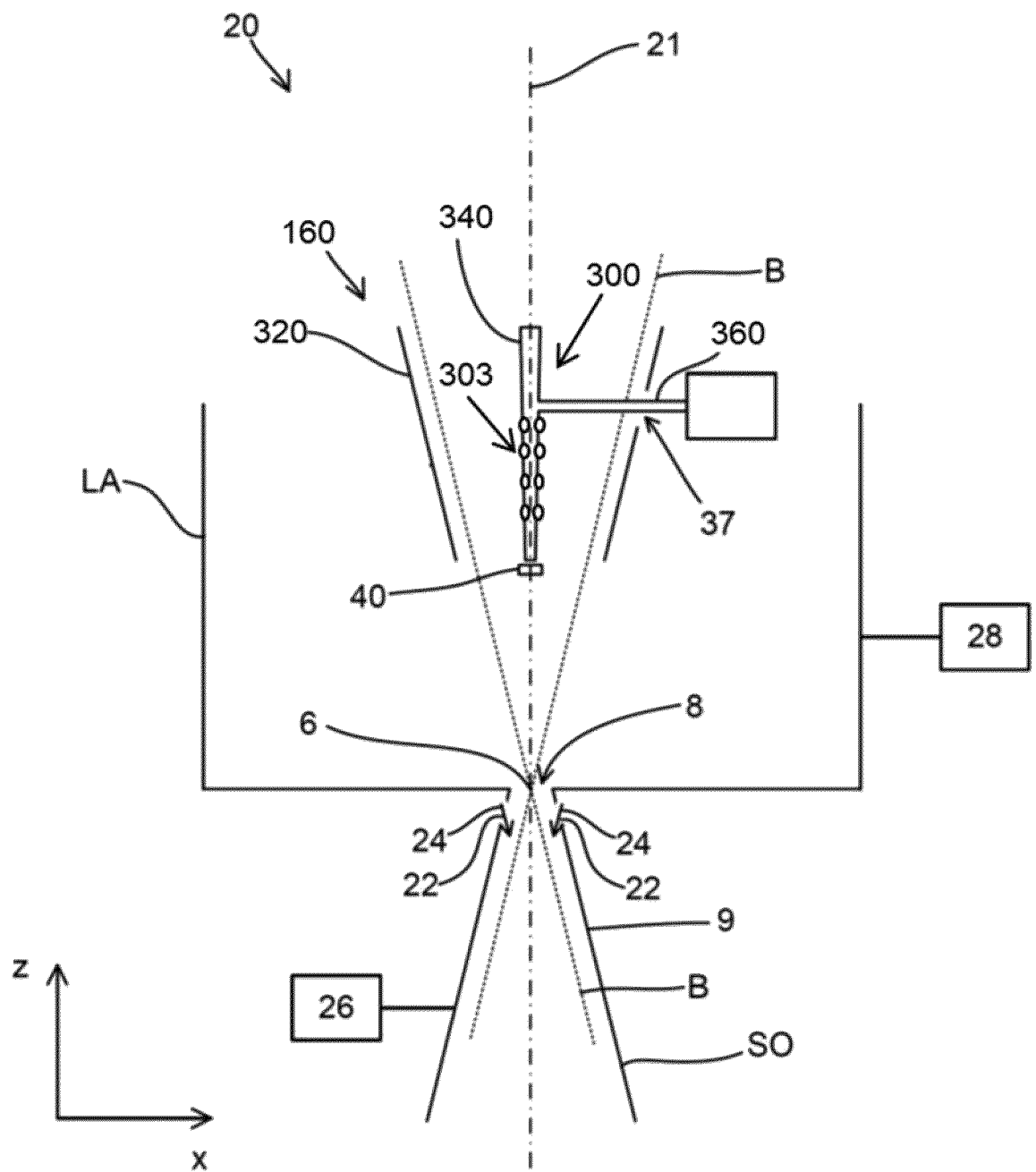
FIG. 6 depicts a cross sectional view of a system according to an embodiment of the invention, which may form part of lithographic system shown in FIG. 1.

FIG. 6 shows the deflection apparatus 160 according to an embodiment of the invention, which is disposed outside the housing 9 and arranged to change a trajectory of particles exiting the housing 9 through the exit aperture 8.

The deflection apparatus 160 comprises a flow nozzle device 300 and an adhesive surface structure 320, disposed outside the housing 9, and proximate to the exit aperture 8.

The flow nozzle device 300 is disposed within the diverging radiation cone of the radiation beam B. In particular, the flow nozzle device 300 comprises a main portion 340 that is provided generally in the centre of this radiation cone and which extends along the main axis of the radiation cone. The main portion 340 of the flow nozzle device 300 may be generally cylindrical, although it may taper at a similar angle to that of the radiation cone. The flow nozzle device 300 may further comprise a support portion 360 arranged to support the main portion 300.

The flow nozzle device 300, when operable is configured to output a jet flow of fluid in a direction at least partially across the exit aperture. In one embodiment, the direction may be perpendicular to the optical axis 21. The main portion 340 of the flow nozzle device 300 may comprise a plurality of nozzle holes 303. In an embodiment, the nozzle holes may be homogenously distributed over the surface so that the output jet flow of fluid is generally homogenously distributed in azimuthal direction of the radiation cone B. The output jet flow of fluid may be a gas, in particular $H_2$. Gas velocity from the flow nozzle device 300 may be of the order of 200 to 3000 m/s. Gas pressure from the flow nozzle device 300 may be of the order of 5 to 100 Pa.

The output jet flow from the flow nozzle device 300 will exert a drag force on debris particles proportional to an area of the debris particles.

The drag force exerted on debris particles is in a direction at least partially across the exit aperture 8. The drag force may be generally radial in the radiation beam cone B and may therefore act to decouple any charged debris particles from the trajectory of the radiation beam B. The drag force may be generally radial thereby pushing debris particles coming through the opening 8 out of the optical path.

Although disposed within the radiation cone of the radiation beam B, as discussed further below, the flow nozzle device 30B is generally disposed within a shadow of the obscuration 17 of the radiation source SO. Advantageously, such an arrangement reduces the amount of radiation B which is absorbed by the flow nozzle device 300.

The adhesive surface structure 320 may comprise an adhesive layer to stick the particle that may comprise tin. The adhesive surface structure 320 is configured to receive an particle with a speed and generally stop the particle or decrease the speed by at least 30% after receiving the particle. The drag force exerted by the output jet flow from the flow nozzle device 300 on debris particles may be generally radial in the radiation beam cone B towards the adhesive surface structure 320, thereby enhancing the probability of debris particles being stopped by the adhesive surface structure 320.

In an embodiment, the adhesive surface structure 320 may be hollow and is disposed at least partially outside of the radiation cone of the radiation beam B. The adhesive surface structure 320 may be disposed outside of a light path of the radiation beam B. The adhesive surface structure 320 is generally frusto-conical in shape, an angle of the adhesive surface structure 320 generally matching that of the cone of radiation SO such that a generally uniform gap may be formed therebetween. The gap may, for example be of the order of 2 mm. The flow nozzle device 300 and the adhesive surface structure 320 are generally axially aligned and have generally matching axial extents.

In an embodiment, the flow nozzle device 300 is disposed within the hollow adhesive surface structure 320. In order to facilitate this, the support portion 360 of the flow nozzle device may extend (generally radially in the radiation beam cone B) through adhesive surface structure 320. In particular, the support portion 360 may also comprise flow duct to supply flow of fluid to the main portion 340 of the flow nozzle device 300.

The flow nozzle device 300 and the adhesive surface structure 320 are separated in a radial direction in the radiation beam cone B. Therefore, the flow nozzle device 300 and the adhesive surface structure 320 are spaced apart in a direction at least partially across the exit aperture 8 (i.e. generally perpendicular to the optical axis 21, which passes through the exit aperture 8). It will be appreciated that the flow nozzle device 300 and the adhesive surface structure 320 being spaced apart in a direction at least partially across the exit aperture 8 may mean that the flow nozzle device 300 and the adhesive surface structure 320 are spaced apart in a direction at least partially perpendicular or transverse to the optical axis 21.

The flow nozzle device 300 and the adhesive surface structure 320 may be disposed within between around 10 cm and 30 cm of the intermediate focus 6. If the flow nozzle device 300 is disposed any closer than this then the shadow of the obscuration 17 may be not sufficiently sharp to avoid significant EUV light absorption by the flow nozzle device 300. Alternatively (not shown), the flow nozzle device 300 may be disposed outside of the light path of the radiation beam B, so not within a shadow of the obscuration 17. The adhesive surface structure 320 may be applied in all the embodiments disclosed.

In an embodiment, the flow nozzle device 300 of FIG. 6 may be combined with the electrodes 30, 32 of FIG. 2. That is, the flow nozzle device 300 may be disposed in close proximity with the electrodes 30, further increasing the pushing effect for the tin particles.

In an embodiment, a magnet may be used to change a trajectory of the fuel particles (e.g. tin particles). An indirect force may be applied on the tin particles (solid or/and liquid) via a drag force that is caused by ions or an ion flow (e.g. hydrogen ions) that are/is deflected away from the optical axis. The ion flow is deflected due to an applied magnetic field. In an embodiment, the applied magnetic field may be perpendicular to the (neutral gas) flow direction that is substantially along the optical axis.

One example embodiment is now described with reference to FIG. 7.

Figure 7:
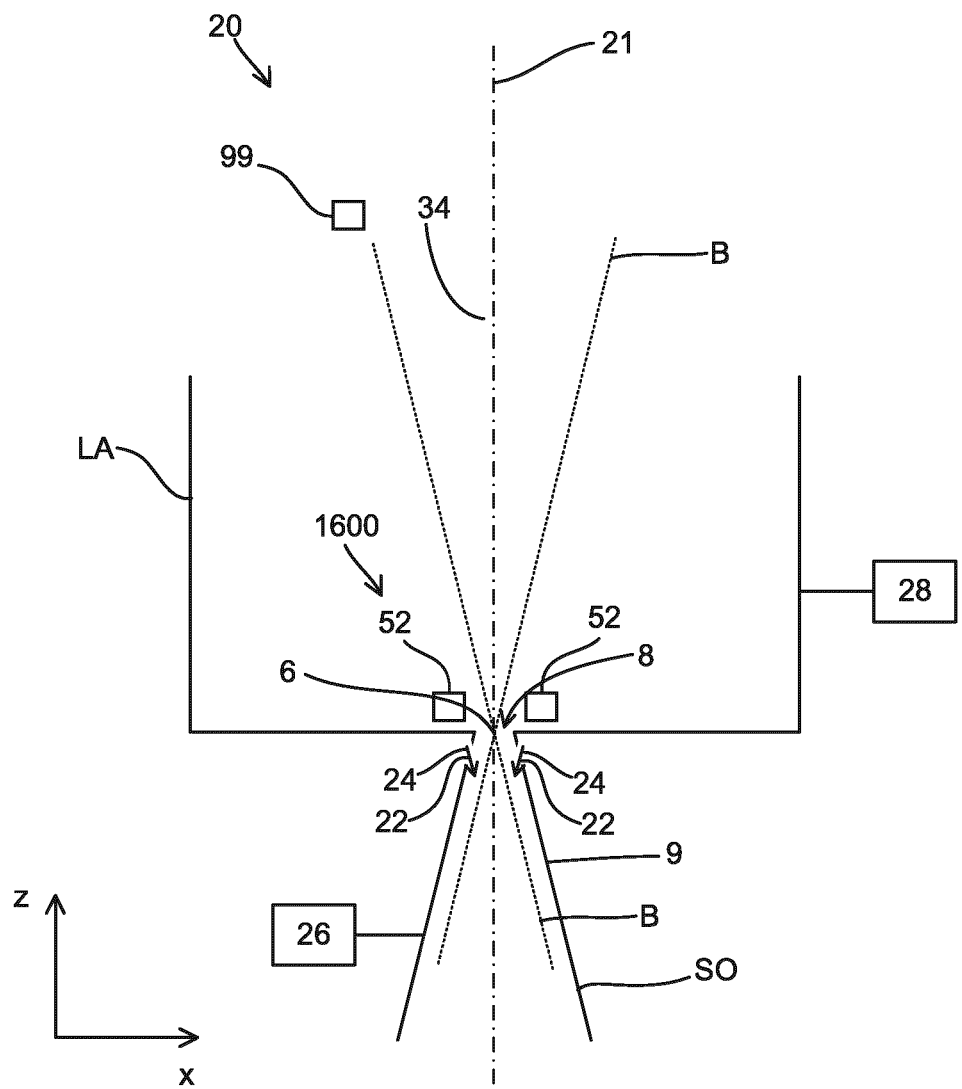
FIG. 7 depicts a deflection apparatus according to an embodiment of the invention.

FIG. 7 shows the deflection apparatus 1600 according to an embodiment of the invention, which is disposed outside the housing 9 and arranged to change a trajectory of particles exiting the housing 9 through the exit aperture/opening 8. FIG. 7 shows a number of components also shown in FIG. 2.

The deflection apparatus 1600 comprises a magnet 52, disposed outside the housing 9, and proximate to the exit aperture 8. An annular Halbach magnet array (cross-section) is shown placed proximate to the intermediate focus 6. The magnet array is made and placed such that the magnetic field lines are substantially perpendicular to the optical axis, here it is shown perpendicular to the page. The deflected ion flows off axis but still in the plate of image. Ions interact with the charged tin particles and impart a net drag force that is several order of magnitudes stronger than the neutral flow drag thanks to the electrostatic forces between the ions and the charged tin particles. The magnet 52 may be disposed between 0 cm and 40 cm from the opening 8 or the intermediate focus 6, preferably between 0 cm and 20 cm, more preferably between 0 cm and 10 cm to increase the deflection efficiency. The magnet 52 may be disposed outside of the light path of the radiation beam B. Alternatively (not shown), the magnet 52 may be disposed within a shadow of the obscuration 17 of the radiation source SO.

In an embodiment, the system or apparatus 20 comprises a debris collector or trap 99 that can be placed at least partly outside the radiation B. The debris collector 99 is for collecting the debris deflected by the deflection apparatus 1600. For the deflection apparatus 160 and the deflection apparatus 1600 the debris collector 99 may be located to one side of the radiation B (e.g. one hemisphere). For the deflection apparatus 16 the debris collector 99 may be located to both sides of the radiation B (e.g. surrounding the radiation B).

In an embodiment, the magnet 52 of FIG. 7 may be combined with the electrodes 30, 32 of FIG. 2. That is, the magnet 52 may be disposed in proximity with the electrodes 30, 32, further increasing the pushing effect for the tin particles. The magnet 52 may be disposed closer to the opening 8 or the intermediate focus 6 compared to the electrodes 30, 32 of FIG. 2.

In an embodiment, the magnet 52 of FIG. 7 may be combined with the flow nozzle device 300 of FIG. 6. That is, the magnet 52 may be disposed in proximity with the flow nozzle device 300, further increasing the pushing effect for the tin particles. The magnet 52 may be disposed closer to the opening 8 or the intermediate focus 6 compared to the flow nozzle device 300 of FIG. 2.

In an embodiment, the magnet 52 of FIG. 7 may be combined with the electrodes 30, 32 of FIG. 2 and with the flow nozzle device 300 of FIG. 6. That is, the magnet 52 may be disposed in proximity with the electrodes 30, 32 and with the flow nozzle device 300, further increasing the pushing effect for the tin particles. The magnet 52 may be disposed closer to the opening 8 or the intermediate focus 6 compared to the electrodes 30, 32 of FIG. 2.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The embodiments may further be described using the following clauses:

1. An apparatus comprising:
   a radiation receiving apparatus provided with an opening operable to receive radiation from a radiation source through the opening;
   the radiation receiving apparatus comprises a deflection apparatus arranged to change a trajectory of a particle through the opening arriving at the radiation receiving apparatus.

2. The apparatus of clause 1 the deflection apparatus is arranged to change the trajectory based on one of the following: —electrostatics; —magnetism; —outputting a flow of fluid; —a combination of electrostatics and magnetism; —a combination of electrostatics and outputting a flow of fluid; —a combination of magnetism and outputting a flow of fluid; —a combination of electrostatics and magnetism and outputting a flow of fluid, or/and the changing the trajectory comprises changing the trajectory away from an optical axis of the received radiation.

3. The apparatus of any of clauses 1 to 2, wherein at least a part of the deflection apparatus is disposed between 0 cm and 40 cm or between 0 cm and 20 cm from the opening.

4. The apparatus of any of clauses 1 to 3, the deflection apparatus is arranged such that, in use, at least a part of the deflection apparatus is disposed within a shadow of an obscuration, said obstruction located in the radiation source.

5. The apparatus of any of clauses 1 to 4, the deflection apparatus comprises:
   two electrodes proximate to the opening, the two electrodes spaced apart in a direction at least partially across the opening.

6. The apparatus of clauses 5, the two electrodes are configured to deplete plasma in at least a part of space between the two electrodes in use.

7. The apparatus of any of clauses 5 to 6, wherein a first one of the two electrodes is arranged such that, in use, the first electrode is at least partially disposed within a shadow of an obscuration, said obstruction located in the radiation source.

8. The apparatus of clause 7 the first electrode comprises a first portion and plurality of fins extending from the first portion and the first electrode is arranged such that, in use, the first portion is substantially disposed within the shadow of the obscuration and the plurality of fins extend out of said shadow.

9. The apparatus of any of clauses 7 to 8 wherein a second one of the two electrodes is hollow and is disposed outside of a light path of the radiation and the first electrode is disposed within the hollow second electrode.

10. The apparatus of any of clauses 5 to 9 the two electrodes are both disposed outside of a light path of the radiation.

11 The apparatus of any of clauses 5 to 10 wherein one of the two electrodes is connected to ground and the other one of the two electrodes is negatively biased.

12. The apparatus of any of clauses 5 to 11 the apparatus further comprises a voltage supply operable to maintain a potential difference of the order of 100 to 1000 V between the two electrodes.

13. The apparatus of any of clauses 1 to 4, the deflection apparatus comprises:
   a nozzle device, when operable configured to output a jet flow of fluid in a direction at least partially across the opening.

14. The apparatus of clauses 13, the nozzle device is arranged such that, in use, the nozzle device is at least partially disposed within a shadow of an obscuration, said obstruction located in the radiation source.

15 The system of any of clauses 13 to 14, the nozzle device comprises a plurality of nozzles substantially along a direction of the received radiation.

16. The apparatus of any of clauses 1 to 4, the deflection apparatus comprises a magnet.

17. The apparatus of clause 16, the magnet is disposed outside of a light path of the radiation.

18. The apparatus of any of clauses 16 to 17, the magnet comprises an annular Halbach magnet.

19 The apparatus of any of clauses 16 to 18, wherein magnetic field induced by the magnet is substantially perpendicular to an optical axis of the radiation.

20. The apparatus of any of clauses 1 to 4, the deflection apparatus comprises any one of the following: a combination of the two electrodes according to any of clauses 5 to 12 and the magnet according to any of the clauses 16 to 19; a combination of the two electrodes according to any of clauses 5 to 12 and the nozzle device according to any of the clauses 13 to 15; a combination of the magnet according to any of clauses 16 to 19 and the nozzle device according to any of the clauses 13 to 15; a combination of the two electrodes according to any of clauses 5 to 12, the magnet according to any of the clauses 16 to 19 and the nozzle device according to any of the clauses 13 to 15.

21. The apparatus of any preceding clause, wherein at least a part of the deflection apparatus is provided with a shield arranged to reduce amount of radiation that is incident on said at least a part of the deflection apparatus.

22. The apparatus of any preceding clause, wherein at least a part of the deflection apparatus is provided with a textured surface arranged to reduce scattering of the particle in a direction generally from outside the opening towards inside the opening of the radiation receiving apparatus.

23. The apparatus of any preceding clause, wherein at least a part of the deflection apparatus is provided with a polished surface arranged to reduce absorption of radiation incident thereon.

24. The apparatus of any preceding clause, wherein a pressure of gas in the vicinity of the deflection apparatus is of the order of 10 Pa or less.

25. The apparatus of any preceding clause, the deflection apparatus further comprises a structure disposed at least partially outside a light path of the radiation and at least partially along a direction at least partially across the opening, the structure is configured to receive an particle with a speed and decrease the speed after receiving the particle by at least 30%.

26. The apparatus of any preceding clause, the opening is proximate to an intermediate focus of the radiation or/and the particle comprises tin.

27. A lithographic apparatus arranged to project a pattern from a patterning device onto a substrate, comprising the apparatus of any preceding clause.

28. A lithographic system comprising the apparatus and the radiation source of any of clauses 1 to 26; the radiation receiving apparatus is operable to form an image of a patterning device on a substrate using said radiation.

29. A device manufactured using the apparatus according to any of clauses 1 to 26.

The invention claimed is:

1. An apparatus comprising:
a radiation receiving apparatus provided with an opening operable to receive radiation from a radiation source through the opening;
wherein the radiation receiving apparatus comprises a deflection apparatus arranged to change a trajectory of a particle moving through the opening arriving at the radiation receiving apparatus; and
wherein the deflection apparatus comprises:
first and second electrodes proximate to the opening, the first and second electrodes being spaced apart in a direction at least partially across the opening;
wherein the first electrode comprises:
a first portion substantially disposed within a shadow of an obscuration; and
a plurality of fins extending from the first portion out of the shadow;
wherein the second electrode is hollow and is disposed outside of a light path of the radiation; and
wherein the first electrode is disposed within the second electrode.

2. The apparatus of claim 1, wherein the deflection apparatus is arranged to change the trajectory based on one of the following:
electrostatics;
magnetism;
outputting a flow of fluid;
a combination of electrostatics and magnetism;
a combination of electrostatics and outputting a flow of fluid;
a combination of magnetism and outputting a flow of fluid; or
a combination of electrostatics and magnetism and outputting a flow of fluid,
wherein the changing the trajectory comprises changing the trajectory away from an optical axis of the received radiation.

3. The apparatus of claim 1, wherein at least a part of the deflection apparatus is disposed between 0 cm and 40 cm or between 0 cm and 20 cm from the opening.

4. The apparatus of claim 1, wherein the deflection apparatus is arranged such that, in use, at least a part of the deflection apparatus is disposed within a shadow of an obscuration, the obscuration located in the radiation source.

5. The apparatus of claim 1, wherein the first and second electrodes are configured to deplete plasma in at least a part of space between the first and second electrodes in use.

6. The apparatus of claim 1, wherein:
the first electrode is connected to ground and the second electrode is negatively biased.

7. The apparatus of claim 1, wherein the deflection apparatus comprises:
a nozzle device which, when operable, is configured to output a jet flow of fluid in a direction at least partially across the opening.

8. The apparatus of claim 7, wherein the nozzle device is arranged such that, in use, the nozzle device is at least partially disposed within a shadow of an obscuration, the obscuration located in the radiation source.

9. The apparatus of claim 1, wherein the deflection apparatus comprises a magnet.

10. The apparatus of claim 9, wherein the magnet is disposed outside of a light path of the radiation.

11. The apparatus of claim 9, wherein a magnetic field induced by the magnet is substantially perpendicular to an optical axis of the radiation.

12. The apparatus of claim 1, wherein:
at least a part of the deflection apparatus is provided with a shield arranged to reduce an amount of radiation that is incident on the at least a part of the deflection apparatus; and/or
at least a part of the deflection apparatus is provided with a textured surface arranged to reduce scattering of the particle in a direction generally from outside the opening towards inside the opening of the radiation receiving apparatus.

13. The apparatus of claim 1, wherein the opening is proximate to an intermediate focus of the radiation and/or the particle comprises tin.

14. The apparatus of claim 1, wherein:
the deflection apparatus comprises an adhesive surface structure configured to receive the particle and generally stop the particle or decrease a speed of the particle; and
the adhesive surface structure is hollow and is disposed at least partially outside of the light path of the radiation.

15. A lithographic apparatus arranged to project a pattern from a patterning device onto a substrate, comprising:
a radiation receiving apparatus provided with an opening operable to receive radiation from a radiation source through the opening; and
a deflection apparatus arranged to change a trajectory of a particle moving through the opening arriving at the radiation receiving apparatus, the deflection apparatus comprising:
first and second electrodes proximate to the opening, the first and second electrodes being spaced apart in a direction at least partially across the opening;
wherein the first electrode comprises:
a first portion substantially disposed within a shadow of an obscuration; and
a plurality of fins extending from the first portion out of the shadow;
wherein the second electrode is hollow and is disposed outside of a light path of the radiation; and
wherein the first electrode is disposed within the second electrode.

* * * * *

UNITED STATES PATENT AND TRADEMARK OFFICE
CERTIFICATE OF CORRECTION

PATENT NO. : 12,332,570 B2
APPLICATION NO. : 17/794897
DATED : June 17, 2025
INVENTOR(S) : Albright et al.

It is certified that error appears in the above-identified patent and that said Letters Patent is hereby corrected as shown below:

On the Title Page

Column 1, Item (72), in "Inventors", Line 3, delete "Joseph Banine," and replace with --Banine,--.

In the Specification

In Column 22, Line 1, delete "the" and replace with --wherein the--;

In Column 22, Line 5, delete "clause 1" and replace with --clause 1 wherein--;

In Column 22, Line 12, delete "the" and replace with --wherein the--;

In Column 22, Line 19, delete "the" and replace with --wherein the--;

In Column 22, Line 23, delete "the" and replace with --wherein the--;

In Column 22, Line 28, delete "the" and replace with --wherein the--;

In Column 22, Line 36, delete "the" and replace with --wherein the--;

In Column 22, Line 38, delete "the" and replace with --wherein the--;

In Column 22, Line 40, delete "the" and replace with --wherein the--;

In Column 22, Line 44, delete "the" and replace with --wherein the--;

In Column 22, Line 46, delete "the" and replace with --wherein the--;

In Column 22, Line 49, delete "11" and replace with --11.--;

Signed and Sealed this
Twenty-second Day of July, 2025

Coke Morgan Stewart
*Acting Director of the United States Patent and Trademark Office*

CERTIFICATE OF CORRECTION (continued)
U.S. Pat. No. 12,332,570 B2

In Column 22, Line 52, delete "the" and replace with --wherein the--;

In Column 22, Line 56, delete "the" and replace with --wherein the--;

In Column 22, Line 61, delete "the" and replace with --wherein the--;

In Column 22, Line 65, delete "the" and replace with --wherein the--;

In Column 23, Line 1, delete "the" and replace with --wherein the--;

In Column 23, Line 3, delete "the" and replace with --wherein the--;

In Column 23, Line 5, delete "the" and replace with --wherein the--;

In Column 23, Line 10, delete "the" and replace with --wherein the--;

In Column 23, Line 39, delete "the" and replace with --wherein the--;

In Column 23, Line 46, delete "the" and replace with --wherein the--;

In Column 23, Line 53, delete "26; the" and replace with --26; wherein the--.